United States Patent
Alfassi et al.

(10) Patent No.: US 9,367,652 B2
(45) Date of Patent: Jun. 14, 2016

(54) CROSS-DOMAIN DATA ARTIFACTS CONSOLIDATION IN MODEL CONTEXT

(71) Applicant: GlobalFoundries U.S. 2 LLC, Hopewell Junction, NY (US)

(72) Inventors: Odellia Alfassi, Haifa (IL); Amit Fisher, Nofit (IL); Fabiana Fournier, Givat Ela (IL); Nir Mashkif, Ein Carmel (IL); Aviad Sela, Yokneam (IL)

(73) Assignee: GLOBALFOUNDRIES INC., Grand Cayman (KY)

( * ) Notice: Subject to any disclaimer, the term of this patent is extended or adjusted under 35 U.S.C. 154(b) by 523 days.

(21) Appl. No.: 13/869,034

(22) Filed: Apr. 24, 2013

(65) Prior Publication Data

US 2014/0324393 A1    Oct. 30, 2014

(51) Int. Cl.
*G06F 17/50* (2006.01)

(52) U.S. Cl.
CPC ............. *G06F 17/5009* (2013.01); *Y02T 10/82* (2013.01)

(58) Field of Classification Search
CPC ...... G06F 17/5009; G06F 17/50; Y02T 10/82
USPC ............................................................ 703/1
See application file for complete search history.

(56) References Cited

U.S. PATENT DOCUMENTS

| 6,591,278 B1 * | 7/2003 | Ernst ................. G06F 17/30557 |
| 2004/0044990 A1 * | 3/2004 | Schloegel ................. G06F 8/34 717/113 |
| 2007/0191979 A1 * | 8/2007 | Zeng ..................... G06Q 10/02 700/97 |
| 2009/0172632 A1 | 7/2009 | Kashai et al. |
| 2011/0098837 A1 * | 4/2011 | Yucel et al. .................... 700/104 |
| 2011/0264666 A1 * | 10/2011 | Gieseke ........................ 707/741 |

FOREIGN PATENT DOCUMENTS

WO    2010046734    4/2010

OTHER PUBLICATIONS

Kyo C. Kang; Sajoong Kim; Jaejoon Lee; Kijoo Kim; Gerard Jounghyun Kim; Euiseob Shin; "FORM: A Feature-Oriented Reuse Method with Domain-Specific Reference Architectures" Nov. 21, 2001. pp. 1-28.*

Ricardo de Almeida Falbo; Giancarlo Guizzardi, "An Ontological Approach to Domain Engineering" Computer Science Department, Federal University of Espirito Santo, Jun. 2002, 9 pages.*

* cited by examiner

*Primary Examiner* — Dwin M Craig

(57) ABSTRACT

A computerized method to provide an enriched unified model data index by generating a unified model data index by indexing shared syntax elements of data artifacts that describe engineering and non-engineering domains, creating instances of an engineering reference model describing model properties that define blocks and relationships between each of the data artifacts for each of the engineering and non-engineering domains, and enriching the unified model data index by adding the relationships having shared syntax elements of at least one instance of the engineering reference model to the shared syntax elements of the unified model data index.

15 Claims, 10 Drawing Sheets

CROSS-DOMAIN DATA ARTIFACTS CONSOLIDATION IN MODEL CONTEXT

BACKGROUND

The present invention, in some embodiments thereof, relates to systems and methods of cross-domain system engineering and, more specifically, but not exclusively, to system engineering modeling of products and processes whose development, maintenance, improvement and usage utilizes engineering data artifacts spanning across multiple domains.

System engineering is used to model products, parts of products, processes and business process. The complexity of systems, such as cars, airplanes and personal electronic product (e.g. Tablets, smartphones), is growing. The complexity of a system often cannot be comprehended by a single person, and therefore skilled teams are often required for tasks of designing, developing, verifying, testing, maintaining, improving, manufacturing, marketing and selling of products, processes and/or services. The team's skills are often interdisciplinary, spanning across multiple engineering and non-engineering domain such as: hardware, software, electrical engineering, mechanical engineering, system architecture, manufacturing, computer-human interaction, industrial design etc. System engineering problem solving, such as verifying requirements fulfillment, design and cost concerns, typically involves multiple disciplines and domains. Each of these domains typically has specialized engineering tools, terminologies, and workflow processes.

Applying each of the above mentioned skills as part of cross-domain system engineering, benefits from a consolidated view of the different domains. A consolidated view contributes to the coherency, reliability and consistency of a system. The consolidated view allows an effect of design modifications in a one domain resonant to the design other related domains within the system. For example, modifying the distance range of a driver seat may affect the requirements for safety testing and compliance with industry regulations. To maintain the range of a car's center of gravity the materials of the driver seat may be modified to lower its weight, which in turn would affect the seat design. In this example the user experience domain affects diverse domains from testing and regulations compliance to industrial design and manufacturing materials.

Attempts to collaborate data across domains include practices such as: 1) Peer-to-peer integration practices 2) Distributed integration systems and 3) Model to model interoperability. According to peer-to-peer integration practices, engineering tools are required to provide interfaces that allow adaption of data to various environments, for example programming SDK APIs or Web-Services. Other practices relate to distributed systems, which leverage relaxed interaction approaches, for example the Representational State Transfer (REST) software architecture style for distributed hypermedia systems such as the World Wide Web, or Open Services for Lifecycle Collaboration (OSLC). These practices attempt to provide new interaction protocol specifications to formalize basic resources and behaviors of domains. Other practices relate to model to model interoperability. Cross-domain data collaboration and interoperability may further require definition of one or more transformations which map input model resources of one domain to target model resources of another domain. A sample transformation is an Engineering Bill of Material (EBOM) authored in Siemens Team Center Product Lifecycle Management (PLM) environment and transformed to the Manufacturing Bill of Material (MBOM) of a SAP environment (Systems—Applications—Products). Such transformations may be defined by existing industry engineering tools using common standard languages like OMG-QVT. Providing and maintaining content packs of such transformations and mappings require large investments of time and effort by vendors.

SUMMARY

According to an aspect of some embodiments of the present invention there is provided a computerized method for consolidating data artifacts across domains in a context of an engineering reference model, the method comprising: generating a unified model data index by indexing a plurality of elements of a plurality of data artifacts, wherein the plurality of data artifacts describe a plurality of engineering and non-engineering domains; creating an engineering reference model describing the plurality of engineering and non-engineering domains; enriching the unified model data index by adding a plurality of relations between a plurality of elements of at least one instance of the engineering reference model and a plurality of elements of the unified model data index.

Optionally, the method further comprises presenting at least one part of the at least one instance of the engineering reference model. Optionally, the method further comprises allowing access to at least one of the unified model data index and enriched the unified model data index. Optionally, presenting is a cross-domain view point, across the plurality of engineering and non-engineering domains, of the engineering reference model. Optionally, at least one of the plurality of data artifacts represent a multi-domain engineering product and the at least one part of the at least one instance is selected according to at least one aspect of the multi-domain engineering product. Optionally, at least one aspect is selected from a group consisting of entire product functionality, component-specific functionality, requirement verification, manufacturing cost and bill of materials. Optionally, the method further comprises presenting the data artifacts, thereby allowing a drill-down analysis of the at least one instance. Optionally, the method further comprises acquiring a plurality of shared syntax elements, the plurality of shared syntax elements describing at least one of a plurality of objects, attributes and relationships of the plurality of data artifacts. Optionally, at least one of the plurality of elements of the unified model data index is represented by at least one of the plurality of shared syntax elements in the enriching. Optionally, the method further comprises augmenting at least one of the plurality of data artifacts with elements of the engineering reference model according to the plurality of shared syntax elements. Optionally, generating a unified model data index further comprises filtering the plurality of elements of a plurality of data artifacts. Optionally, adding a plurality of relations is performed by selectively mapping between the plurality of elements of at least one instance of the engineering reference model and the plurality of elements of the unified model data index. Optionally, creating an engineering reference model selectively describes a subset of the plurality of engineering and non-engineering domains. Optionally, describing the plurality of engineering and non-engineering domains comprises describing a plurality of cross-domain relations across the plurality of engineering and non-engineering domains. Optionally, each of a plurality of instances of the engineering reference model enriching has a plurality of hierarchical relationships and the enriching is performed according to the plurality of hierarchical relationships.

According to an aspect of some embodiments of the present invention there is provided a computer program product for consolidating data artifacts across domains in a context of an engineering reference model, the computer program product comprising: a computer readable storage medium; first program instructions to generate a unified model data index by indexing a plurality of elements a plurality of data artifacts, wherein the plurality of data artifacts describe a plurality of engineering and non-engineering domains; second program instructions to create an engineering reference model describing the plurality of engineering and non-engineering domains; and third program instructions to enrich the unified model data index by adding a plurality of relations between a plurality of elements of at least one instance of the engineering reference model and a plurality of elements of the unified model data index; wherein the first, second and third program instructions are stored on the computer readable storage medium.

According to an aspect of some embodiments of the present invention there is provided a system for consolidating data artifacts across domains in a context of an engineering reference model, the system comprising: a processor; an indexing module which generates a unified model data index by indexing a plurality of elements a plurality of data artifacts, using the processor, wherein the plurality of data artifacts describe a plurality of engineering and non-engineering domains; an enrichment module which enriches the unified model data index by adding a plurality of relations between a plurality of elements of at least one instance of an engineering reference model and a plurality of elements of the unified model data index, using the processor.

Optionally, the system further comprises a modeling module which creates an engineering reference model describing the plurality of engineering and non-engineering domains. Optionally, the system further comprises an interface module which performs at least one of acquiring a plurality of shared syntax elements which model elements of a plurality of engineering data artifacts, acquiring at least one engineering reference model, presenting at least one part of at least one instance of an engineering reference model, allowing a user to access an enriched unified model data index, presenting a cross-domain view point of the engineering reference model, presenting the engineering reference model according to at least one aspect of the multi-domain engineering product.

Unless otherwise defined, all technical and/or scientific terms used herein have the same meaning as commonly understood by one of ordinary skill in the art to which the invention pertains. Although methods and materials similar or equivalent to those described herein may be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DETAILED DESCRIPTION

Figure 1:
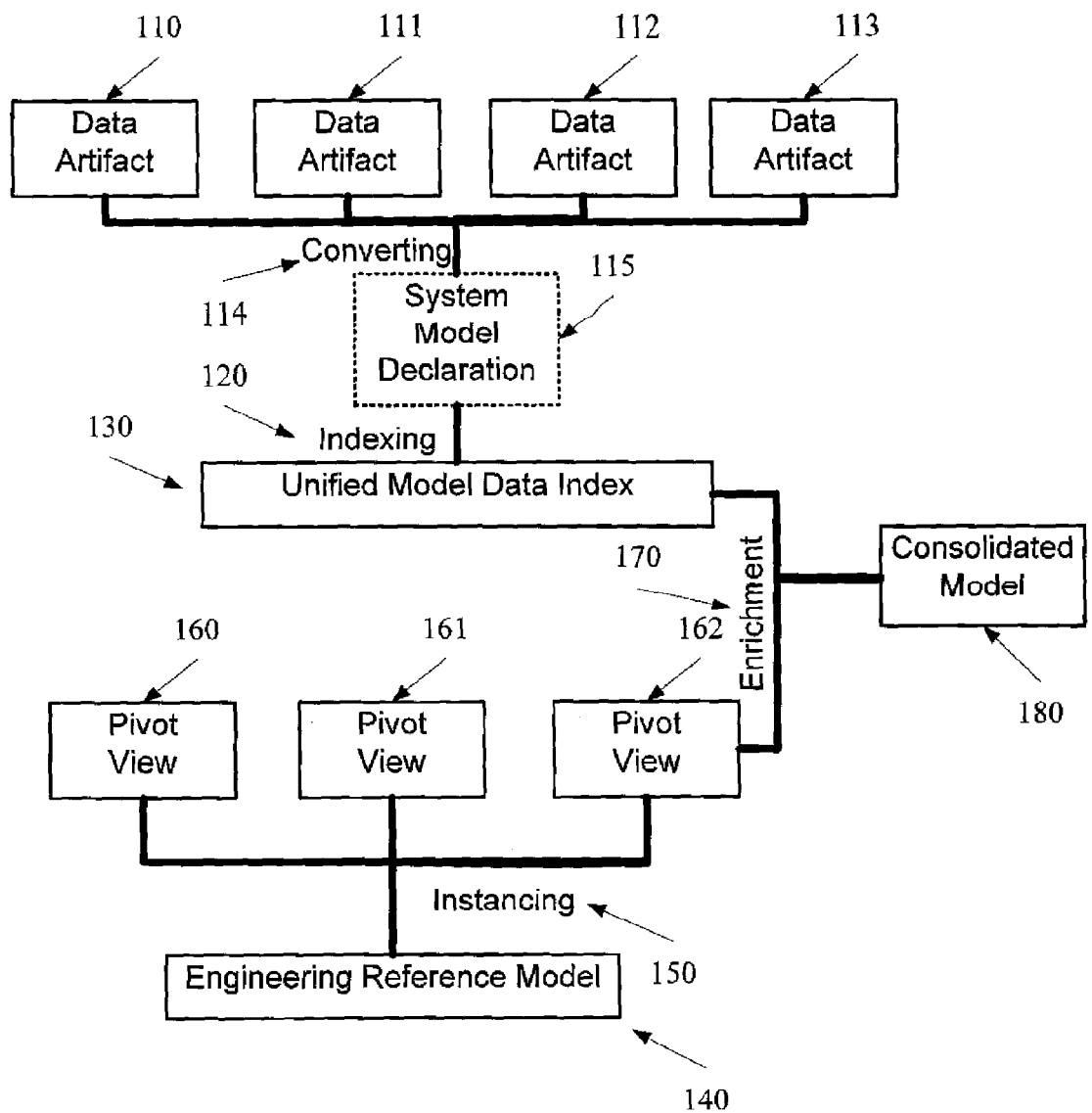
FIG. 1 is an illustration of domain data artifacts appliance which are consolidated and put into a context of an engineering reference model by the processes of indexing and enrichment, according to some embodiments of the present invention.

The present invention, in some embodiments thereof, relates to systems and methods of cross-domain system engineering and, more specifically, but not exclusively, to system engineering modeling of products and processes whose development, maintenance, improvement and usage utilizes engineering data artifacts spanning across multiple domains.

Current approaches to consolidating models from different domains, such as the peer-to-peer integration approach, require development of dedicated software component in order to enable cross-domain connectivity and communication between multiple domain-specific engineering artifacts.

The existing platforms based on one of the aforementioned cross-domain data collaboration solutions, may provide support for creating inter relations between different domain artifacts. For instance, attaching a requirement to a test case each one defined in its own domain. These inter relations spans across different industry standard specifications. However, it is still an open challenge as how to enable users to do a comprehensive reasoning and analysis of a product and/or a process from different viewpoints merging together the different domains into a heterogeneous system view. Such a heterogeneous system view accounts for any type of relations and/or the entire heterogeneous engineering data.

According to some embodiments of the present invention, there are provided methods and systems of generating and presenting consolidated cross-domain data artifacts in a context of an engineering reference model (ERM) and its instances. As used herein, the term "engineering reference model (ERM)" means a meta-model which is a collection of concepts (things, terms, elements) and the relations between them. The engineering reference model is used herein to abstract the properties of models from multiple domains. For example, model properties may be "system", "sub-system", "product line, "component", "part" etc.

An engineering reference model does not consolidate a set of domain-specific models. As opposed to mega meta-model approaches which aim at capturing an entire product, process and/or system in a single consolidated model, the engineering reference model captures blocks and relations between them. Data artifacts, such as test cases, design model, use cases, and class diagrams are indexed. Indexing may improve data lookup and retrieval. The indexed artifacts are mapped to the blocks of the engineering reference model instances. Indexed artifacts mapping is performed during an enrichment process. The enrichment process results in a consolidated model with data artifacts put into a context of an engineering reference model.

According to some embodiments of the present invention, domain data artifacts are consolidated and put into a context of an engineering reference model using the processes of indexing and enrichment. A set of engineering domain-specific models from different engineering domains exist for some system of interest, such as a cyber-physical product. Each engineering domain-specific model may have multiple data artifacts. Typically, several engineering reference models (and hence ERM instances) are used to describe the same system. An engineering reference model is created which defines blocks and relationships between them. As used herein, the term "block" means an entity which is used for decomposing and/or managing a system design. Exemplary blocks are: an engine, a heating system and a navigation system. Typically, a data artifact is associated with to a single block of a pivot view. Instance(s) of the engineering reference model, also referred to herein as "pivot view", are generated. As used herein, the term "pivot view" means an instance of an engineering reference model, which models a specific system. For example, an engineering reference model of a physical architecture of a hybrid car may have an instance of the physical architecture of a Toyota Prius. The original semantics of the data artifacts are mapped/matches/translated into consolidated semantics. The data artifacts are indexed to create a unified model data index. A pivot view is enriched by adding relations between its elements and the unified model data index elements. The result of the enrichment process is a consolidated model.

According to some embodiments of the present invention, a consolidated model enables to search and query based on context of one or more engineering reference models, to easily carry out an impact analysis based on context in the engineering reference model, to efficiently drill down into the related engineering data artifacts, to identified impacted blocks and blocks that are not impacted, and/or to represent a holistic representation of both an engineering reference model and its underling data artifacts.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident Software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Reference is now made to FIG. 1, which is an illustration of domain data artifacts 110-113 which are consolidated and put into a context of an engineering reference model 140 by the processes of indexing 120 and enrichment 170, according to some embodiments of the present invention. Data artifacts 110-114 are indexed to create a unified model data index 120. As defined herein, the term "data artifact" means a by-product which is used for describing a dimension of a product and/or process such as function, architecture element, design element etc. Exemplary data artifacts comprise requirements and design model, use cases model, class diagrams and other UML models. Some artifacts, such as project plans, business cases, and risk assessments, are concerned with the development process itself. Data artifacts are used in disciplines as diverse as, banking and the automotive industry, Aerospace and deface. The data artifacts are generated by engineering tools. As used herein, the term "engineering tool" means a platform for generating one or more data artifacts. Such a platform is typically software which manages domain-specific artifacts and the relations between. Exemplary engineering tools are IBM Rational DOORS used for requirements managements, Rational Change Management (RQM) used for testing management, HP Quality Center™ used for quality assurance (QA) and quality control (QC), IBM Rational Rhapsody™ used for development of real time/embedded components and software, and Siemens Team Center™ used for mechanical design. Elements of data artifacts 110-114 are first converted 114 into elements of a system model declaration (meta-model) before indexing 120. As used herein, the term "system model declaration" 115 means a low level of for representing data artifacts. Such a representation is composed of shared syntax elements and their relationships. Multiple data artifacts, relating to a specific system of interest (or a system of systems), are indexed to create a unified model data index. As used herein, the term "unified model data index" means a data index consolidating multiple data artifacts from multiple domains. Consolidation may be achieved by transformation to a common simplified semantics and/or schema. This is the system model declaration. As used herein, the term "data index" means data structure, and its content, which improves the speed of data lookup and retrieval operations on a stored data. The stored data may be in a data structure, such as a database table or RDF data store. The increased retrieval speed comes at the cost of slower writes and increased storage space. Instancing 150 of an engineering reference model 140 results in pivot views 160-162. Pivot views of a product are optionally be based on product functionality, componentization, product configuration, product line view, product team view, product assembly view, product manufacturing view, marketing view, safety view or the like. In an enrichment process 170 relationships between elements of the pivot view 162 and the unified model data index 120 are added. This result in a consolidated model 180 with data artifacts 110-113 put into a context of an engineering reference model 140. Representation of an engineering reference model 140 may use existing methodologies, such as, but not limited to, semantic-web representation, RDF based syntax and/or OWL semantics, to represent the data artifacts 110-113. Optionally, EMF, XML or any other representation methodologies which are aligned with the selected shared representation of syntax and semantics may be used. Optionally, the enrichment process maps relevant requirement artifacts and/or test artifacts to an ERM instance. Optionally, the requirement artifacts are provided, for example, by Microsoft XLS worksheet and/or Rational Doors. Optionally, the test artifacts are provided, for example, by HP Quality Center.

Figure 2:
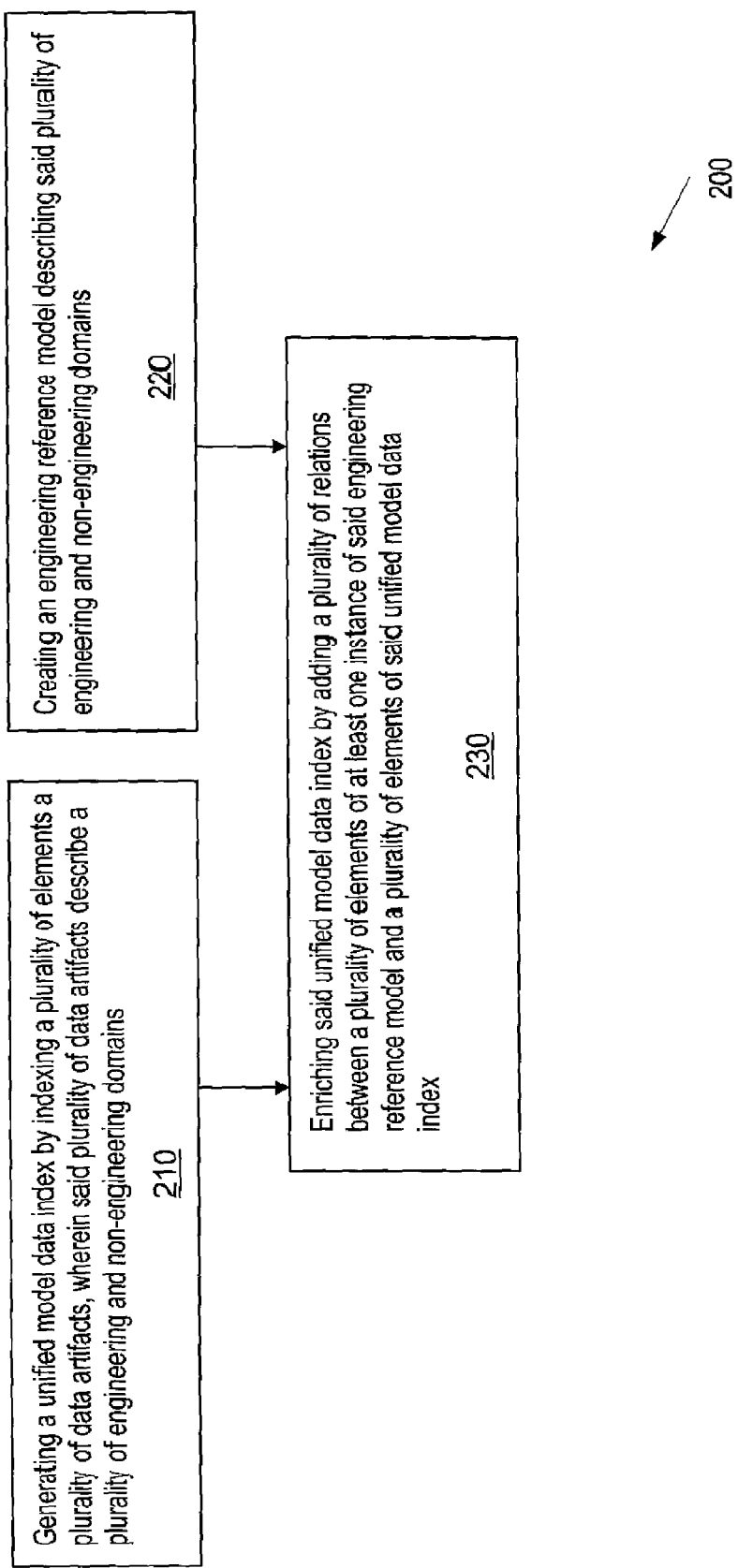
FIG. 2 is an illustration of a computerized method for consolidating data artifacts across domains in a context of an engineering reference model, according to some embodiments of the present invention.

Reference is now made to FIG. 2, which is an illustration of a computerized method for consolidating data artifacts across domains in a context of an engineering reference model, according to some embodiments of the present invention. A unified model data index is generated by indexing a plurality of elements a plurality of data artifacts 210. Indexing may be performed as follow: each of the engineering tool that needs to share its data artifacts provides an adaptor which is responsible for providing transformation and filtering from the original schema of the tools to the unified model data index schema. The data artifacts describe engineering and non-engineering domains. An engineering reference model is created 220. The engineering reference model creation 220 may be performed before, after and/or parallel to the generation of the unified model data index 210. The engineering reference model describes multiple engineering and non-engineering domains. Finally, the unified model data index is enriched 230. The enrichment 230 may be performed by adding relations between elements of a pivot view (which is an instance of the engineering reference model) and elements of the unified model data index. Optionally, the enrichment further comprises adding new properties to existing elements of a unified model data index and/or elements of a pivot view. This results in a consolidated model 180. Optionally, enrichment specification may be due to a method defined by the user of systems such as department of defense architecture framework (DoDAF, ECSAM, and Harmony etc.). Optionally, new data artifacts are defined across domains as part of the enrichment. Optionally, an engineering reference model is created 220 before a indexing a plurality of elements a plurality of data artifacts 210.

The enrichment process 230 may be performed once for multiple pivot views under the context of their shared ERM. Alternatively, the enrichment process 230 is done for each and every pivot view separately. For example, a specific indexed data have 5 pivot views, the enrichment is done for each one of them, 5 enrichment processes altogether. The separate enrichment may be performed under the context of the ERM. Optionally, the pivot views have hierarchical relations. The enrichment may be transferred from one pivot view to the next according to these relationships. Such hierarchical enrichment may be time consuming and less error prone as it would reduce the number of enrichment steps. The enrichment process 230 may utilize one or more algorithms and techniques, such as but not limited to:

Standard conversion techniques—for example simple java code, Ecore, OCL, QVT satisfying any set of user, engineering tool or application predefined transformation rules;

Mapping techniques—lookup tables, manual mapping via UI, scripting and/or command line;

Automated or semi-automated analysis methods such as model matching based on information retrieval (lexical and structural marching), Web Ontology Language (OWL) and/or ontology rules.

Figure 3:
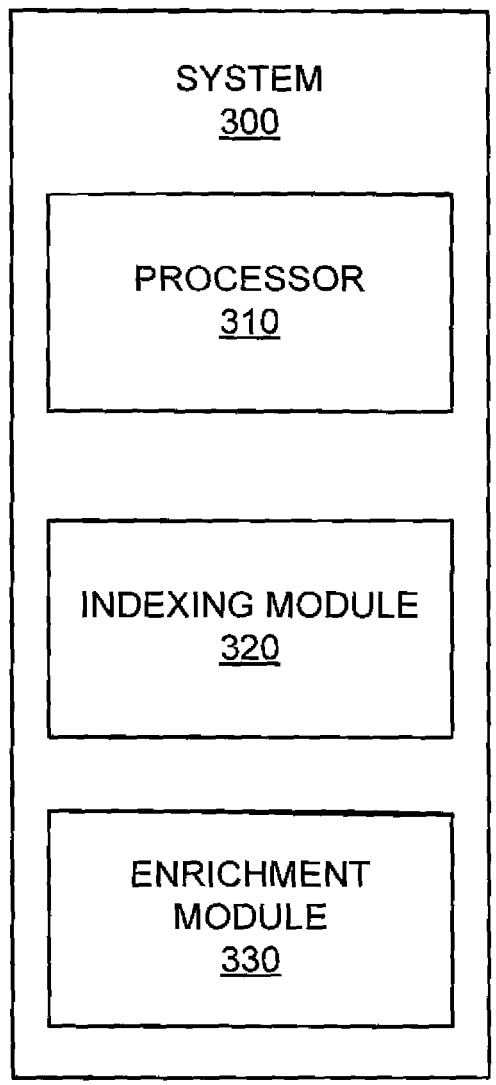
FIG. 3 is an illustration of a system for consolidating data artifacts across domains in a context of an engineering reference model, according to some embodiments of the present invention.

Reference is now made to FIG. 3, illustrating system 300 for consolidating data artifacts across domains in a context of an engineering reference model, according to some embodiments of the present invention. The system comprises a processor 310, an indexing module 320 and an enrichment module 330. For brevity, it should be noted that computing functions described herein may be performed using the processor 310. The indexing module generates a unified model data index 130 by indexing elements of data artifacts 110-113. The indexed resource information for each data artifact 110-113 is kept in one or more repositories. These repositories may be accessible to a central indexing entity. Data access methodologies may vary and include push/pull access, active/silent access, dirty/snapshot access or the like. The indexing type and technique may vary. Optionally, the indexing methodology is Apache Lucene. Optionally, the index is a combination of structure index traditional relational database or Resource Description Framework (RDF) base and unstructured text search such as Lucene based indexing.

Indexing is performed using a processor 310. Multiple data artifacts 110-113 describe multiple engineering and non-engineering domains, as described in FIG. 1. The enrichment module 320 enriches the unified model data index 130. The enrichment 170 is performed by adding relations between elements of a pivot view and elements of a unified model data index 130, as described in FIG. 1. The relations may describe dependencies and/or constraints between two or more object elements. The relations may be unidirectional or multidirectional. Relations may be intra-domain, wherein object elements are all associated with a specific domain and/or inter-domain wherein object elements in a relation are associated with different domains. The relations between object elements may also span across engineering artifacts. Enrichment 170 is performed using the processor 310.

Optionally, the system 300 further comprises a modeling module which creates an engineering reference model 140 describing a plurality of engineering and non-engineering domains. Optionally, the system 300 further comprises an interface module which performs at least one of: 1) acquiring input data 2) present information and/or 3) enable a user to perform tasks, as detailed below. The interface module may acquire shared syntax elements. The shared syntax elements may model elements of engineering data artifacts 110-113. The shared syntax elements describe objects, attributes and/or relationships of elements of data artifacts, between elements of data artifacts and/or between data artifacts using a common syntax. Shared syntax elements may be terms, phrases and/or nomenclatures which are consistent between multiple products, processes, data artifacts and/or system representations. For example, one shared syntax element may represent elements in multiple data artifact, which have different original terminologies. The shared syntax elements may be generated and/or utilized during the enrichment process. Shared syntax elements may be generated by creating elements having characteristics such as a name, identification number etc. The elements may be part of a unifying ontology. The unifying ontology may further include relationships between the elements such as hierarchical relationships, "contains", "part of" etc. Shared syntax elements may also be generated by importing terms, phrases, words, names and/or expressions from external sources such as term lists, databases etc. The interface module may acquire one or more engineering reference models 140. The ERMs may be provided to the interface module in their original terminologies and/or using consolidated shared syntax elements. The interface module may present at least one part of at least one instance of an engineering reference model 140. Partial presentation of an ERM and/or its pivot view may be desired, for example, in order to simplify a view or provide rapid access to commonly used elements and/or operations. The interface module may present a cross-domain view point of the engineering reference model 140. The interface module may present the engineering reference model 140 according to at least one aspect of a multi-domain engineering product. The interface module may allow a user to access an enriched unified model data index 130. The interface module may allow a user to perform an impact analysis.

Figure 4:
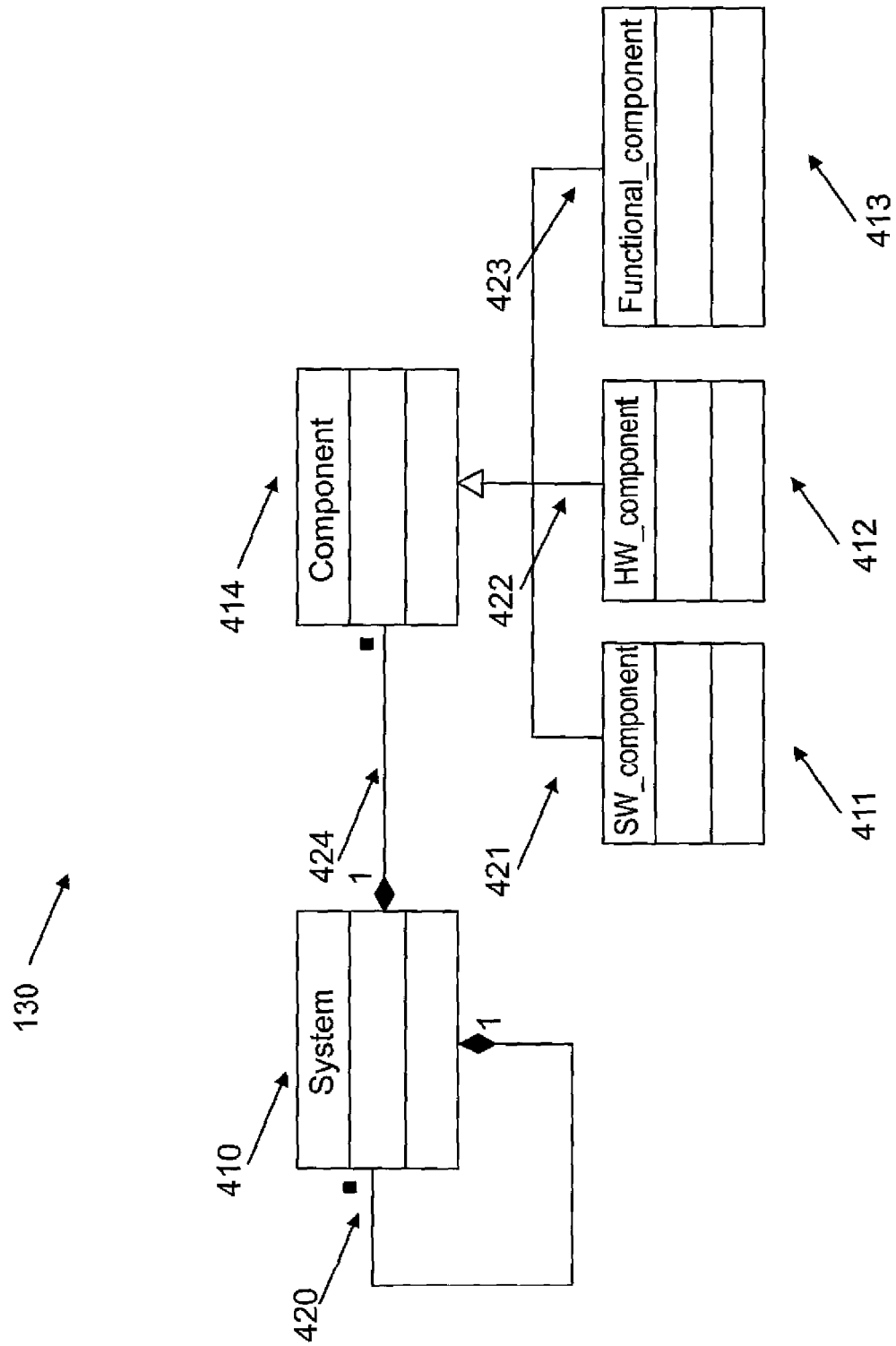
FIG. 4 is an illustration of an exemplary engineering reference model, according to some embodiments of the present invention.

Reference is now made to FIG. 4, illustrating an exemplary engineering reference model 130, according to some embodiments of the present invention. The syntax of the engineering reference model 130 comprises 5 elements 410-414 as its vocabulary: System 410, SW_component 411, HW_component 412, functional component 413 and component 414. The relations 420-424 between the elements 410-414 are depicted as two types of connectors: 'aggregation' 420, 424 and 'type of' 421-423. The elements 410-414 and relations 420-424 of this engineering reference model 130 define a containment hierarchy for a complex system. Any instances of such a reference model 130 must conform to the syntactic constraints and semantic mappings specified in the reference model 130.

Figure 5:
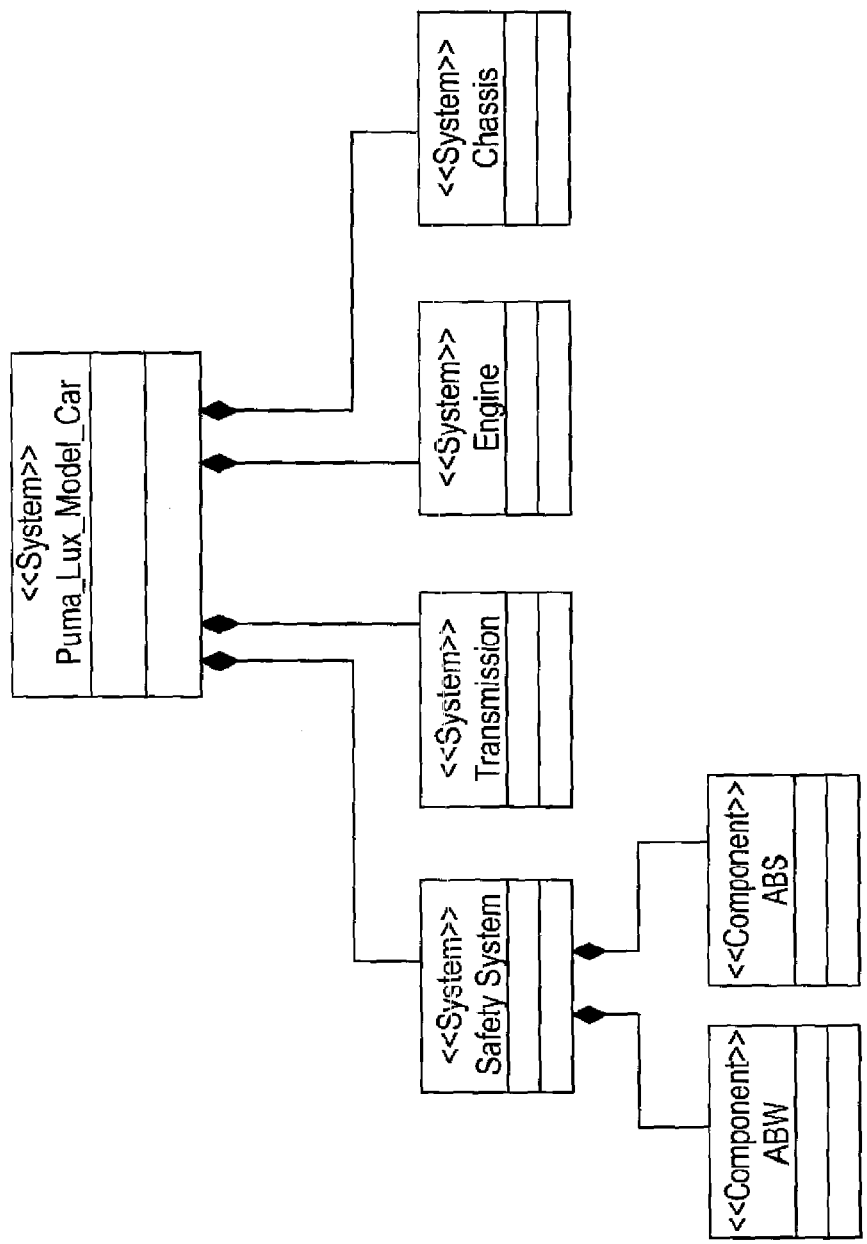
FIG. 5 is an illustration of an exemplary instance of an engineering reference model, according to some embodiments of the present invention.

Reference is now made to FIG. 5, illustrating an exemplary instance of an engineering reference model 500, according to some embodiments of the present invention. The enrichment 170 process maps elements of data artifacts to elements of an engineering reference model and/or one or more of its instances. Elements and relations of data artifacts may be related to more than one engineering reference model and/or more than one ERM instance. The ERM 500 may be generated by a third party tool, for example, an architecture tool such as IBM Rational Rhapsody.

Figure 6A:
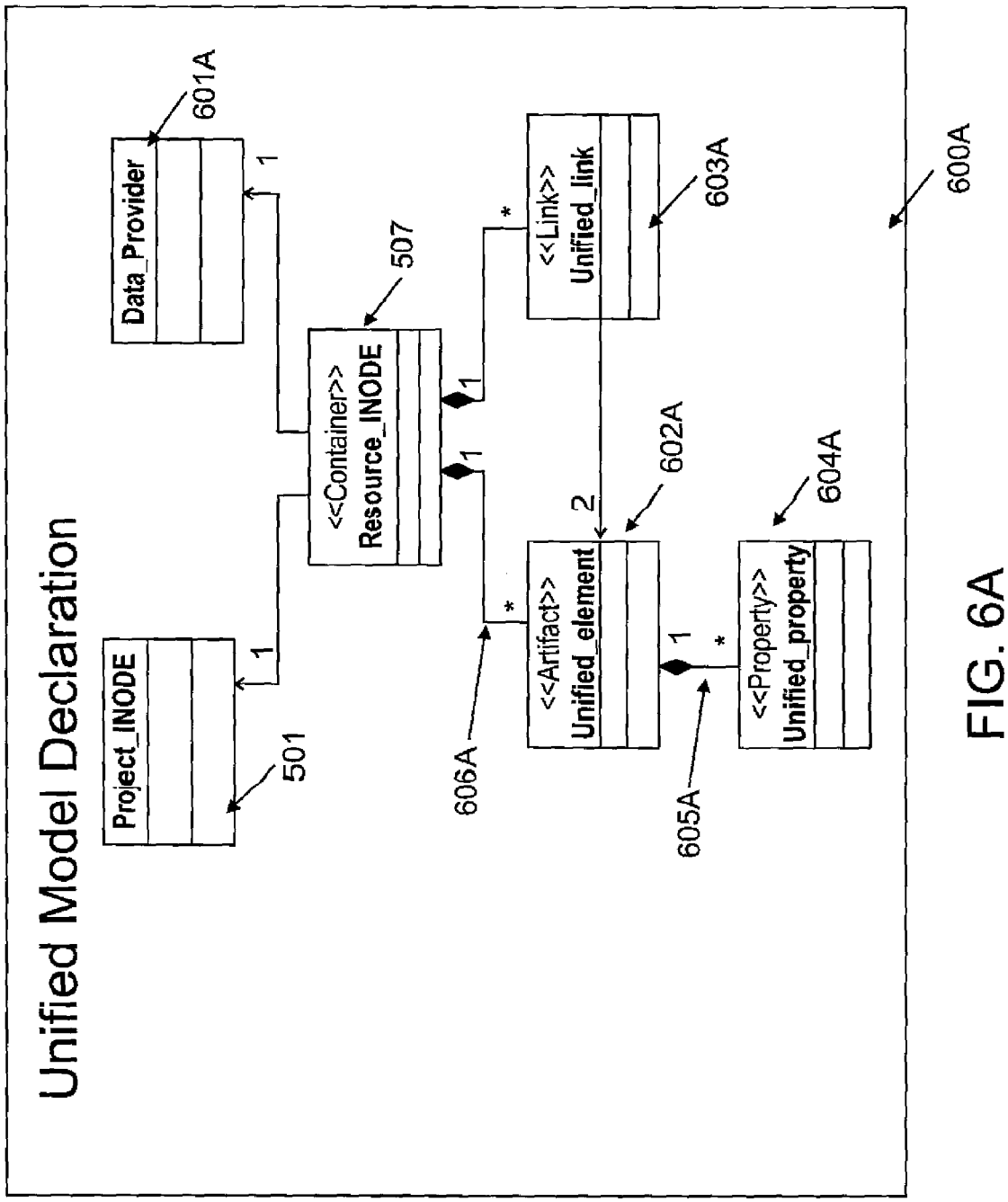
FIG. 6A is an illustration of an exemplary system model declaration with shared syntax elements, according to some embodiments of the present invention.

Reference is now made to FIG. 6A illustrating an exemplary system model declaration 600A with shared syntax elements 602A-604A, according to some embodiments of the present invention. The system model declaration 600A is as described in FIG. 1. The shared syntax elements 602A-604A are as described in FIG. 6B. This exemplary system model declaration 600A, further comprises shared syntax elements 602A-604A such as: A unified element 602A of type artifact, a unified link 603A of type link and/or a unified property 604A of type property. Shared syntax elements 602A-604A may relate 605A, 606A to one another 605A and/or to non shared syntax elements 501, 507, 601A. In this example the non shared syntax elements purpose is to better arrange the unified model data index according to the tools provider, a specific project or a specific indexing grouping.

Figure 6B:
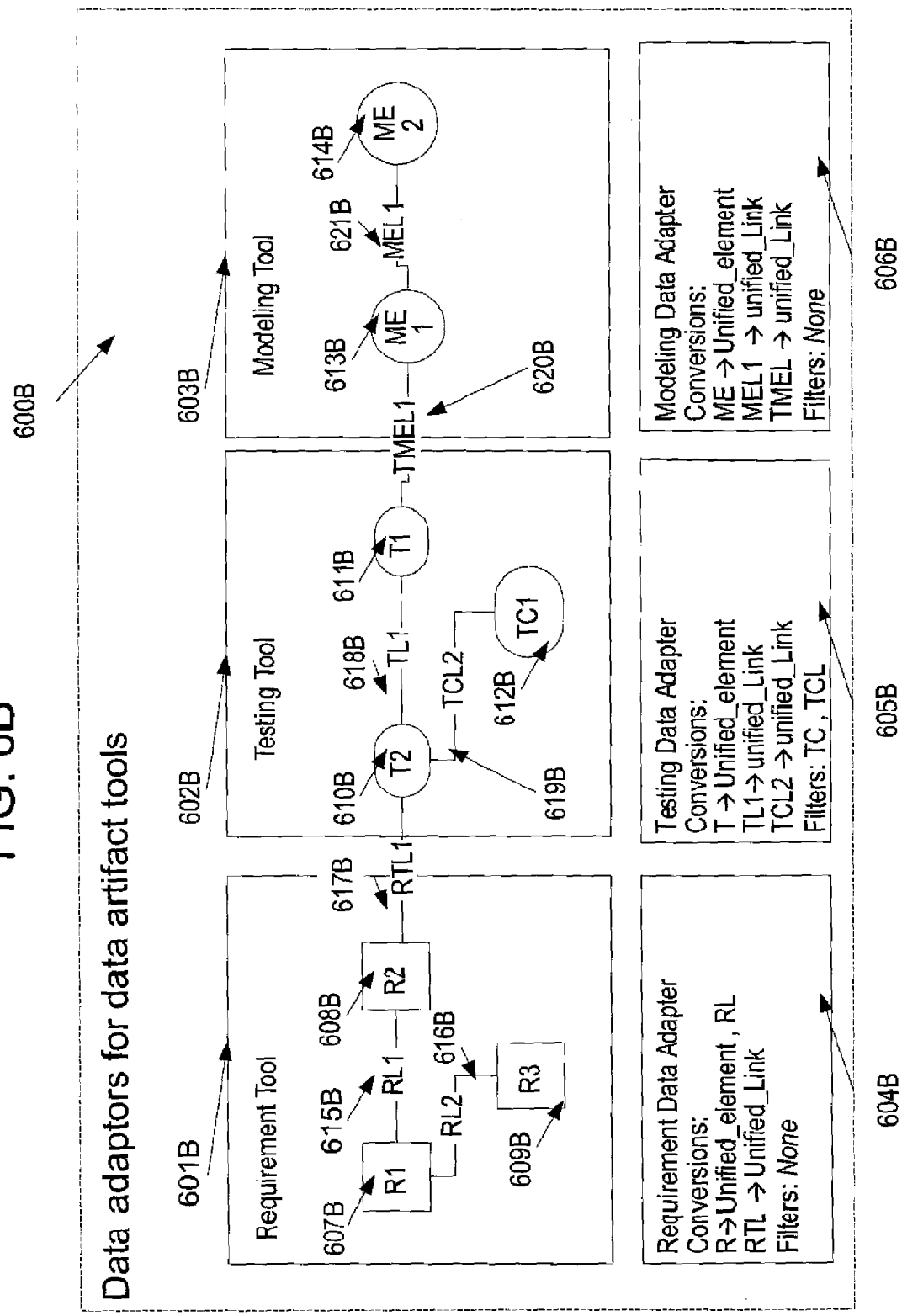
FIG. 6B is an illustration of a conversion of data artifacts elements to a shared syntax elements, according to some embodiments of the present invention.

Reference is now made to FIG. 6B illustrating a conversion of data artifacts elements 607B-621B to a shared syntax elements 602A-604A, according to some embodiments of the present invention. Tools 601B-603B such as requirements 601B, testing 602B and modeling 603B tools generate data artifacts 110-113. Data artifacts comprise data artifacts elements 607B-621B, which herein refer to any data artifact entities comprising: elements 607B-614B, links 615B-621B etc. The data artifacts entities 607B-621B are converted to shared syntax elements 602A-604A. The shared syntax elements are as described in FIG. 6A and/or FIG. 1. Each tool 601B-603B may have an adaptor 604B-606B for performing the conversion. In the requirements tool 601B, the requirement adaptor 604B converts the elements (R1 607B, R2 608B and R3 609B) to a shared syntax element 602A. The requirement adaptor 604B converts the intra data artifact links (RL1 715B and RL2 615B to a unified link 603A. Inter data artifact links such as RTL1 717B and TMEL1 620B are also converted to a unified link 603B. Optionally, an indication of the inter data artifact connectivity feature and/or intra data artifact connectivity is made. The elements 610B-614B and links 618B-621B of the testing tool 602B and the modeling tool 603B are converted to unified links 603A and unified elements 602A in a similar manner to conversion of requirement tools elements 607B-609B and links 615B-617B described above.

Figure 6C:
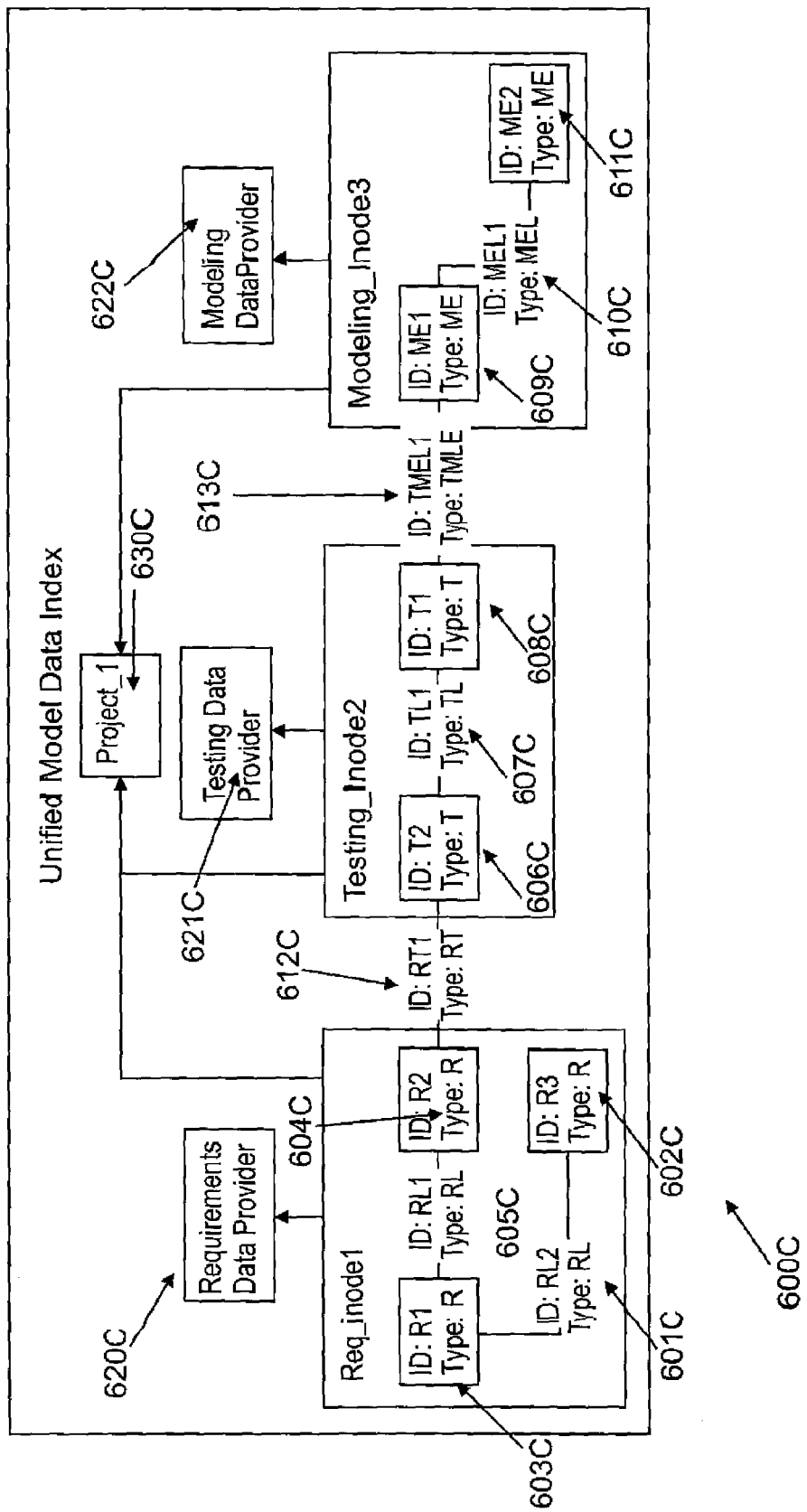
FIG. 6C is an illustration of a unified model data index, according to some embodiments of the present invention.

Reference is now made to FIG. 6C illustrating a unified model data index 600C, according to some embodiments of the present invention. The unified model data index 600C is built according to the data artifacts elements 607B-621B and the shared syntax elements 602A-604A described in FIG. 6B. Each element 601C-613C in the data index 600C has an identification field (ID) and a type field. The data artifact elements 607B-621B may populate the ID fields and/or the type fields. The data artifact elements 607B-621B may further populate fields of the links and/or properties. Optionally, the original ID of a data provider 601A is kept for traceability of the original data artifact. Optionally, the shared syntax elements 602A-604A populate any of the above mentioned fields. The unified model data index 600C provides the context of its elements. For example, elements 601C-605C from requirement inode 1 are associated with a requirements data provider element 620C. The requirements data provider element 620C in turn is associated also with a project element 630C.

Figure 7:
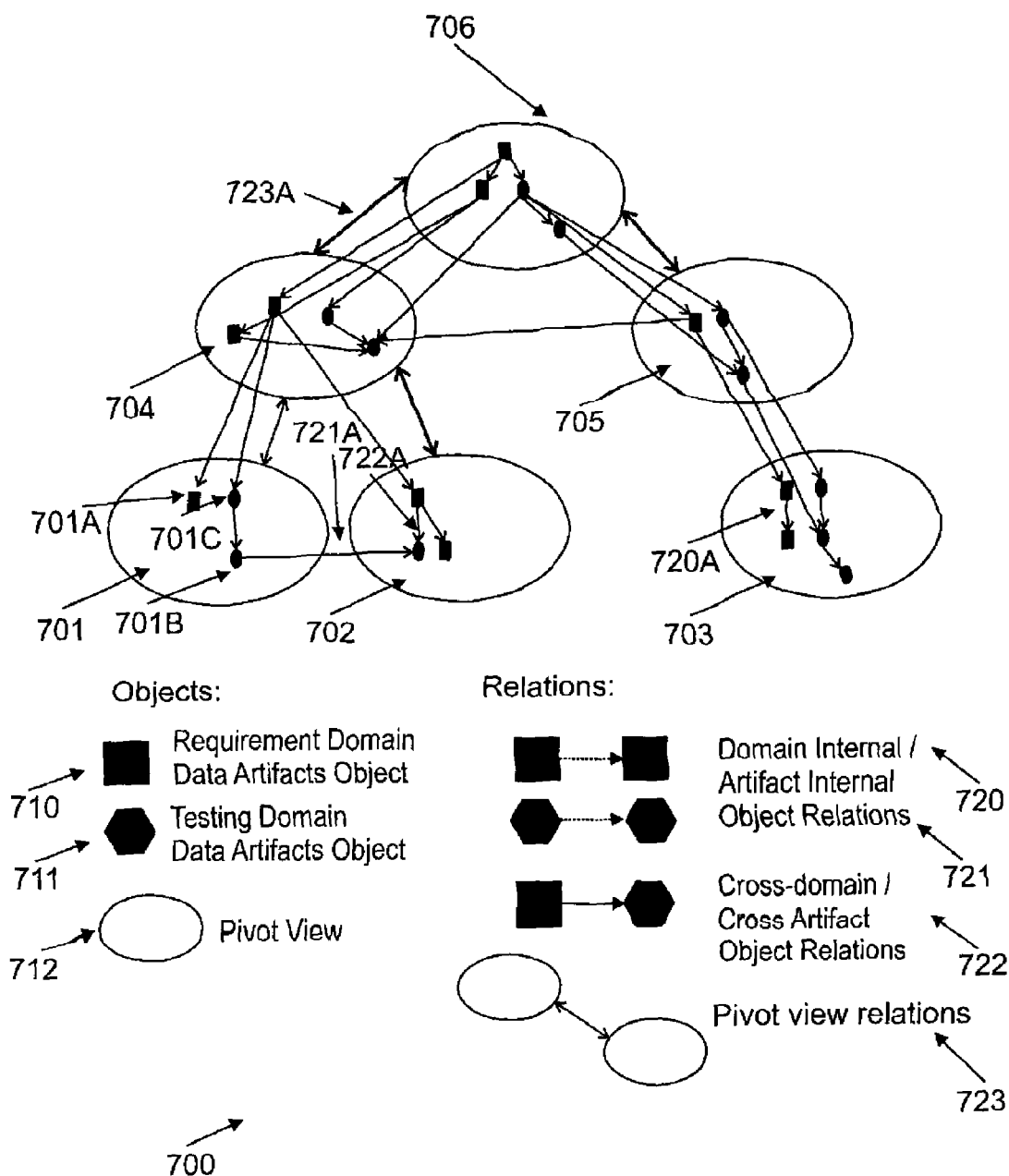
FIG. 7 is an illustration of a graph representing a variety of relationships between pivot views and data artifacts, according to some embodiments of the present invention.

Reference is now made to FIG. 7 illustrating a graph 700 representing a variety of relationships between pivot views and data artifacts, according to some embodiments of the present invention. The graph six pivot views 701-706 of a common product. Each pivot model 701-706 has data elements. For example pivot view 701 includes data elements 701A-701C. The data elements originate from two domain-specific engineering data artifacts. The two domains are represented by different shapes: squares 710 and hexagons 711. Each pivot view is presented by an oval 712 hosting objects of these two domains. For example 701A represents a data element of the first domain 710, while 701B and 701C represents a data element of the second domain 711. Relations between data artifacts comprise intra domain relationships 720, 721 (for example 720A and 721A) and inter-domain relationships 722 (for example 722A). The relationships may be unidirectional or bi-directional. The pivot views themselves 701-706 may be related 723 (for example 723A). The pivot view relations 723 may comprise all possible relationships as demonstrated in the graph 700: relationships between data artifacts to themselves, between data artifacts and domains, between domains and pivot views, between data artifacts and pivot views and between pivot views and themselves.

Figure 8:
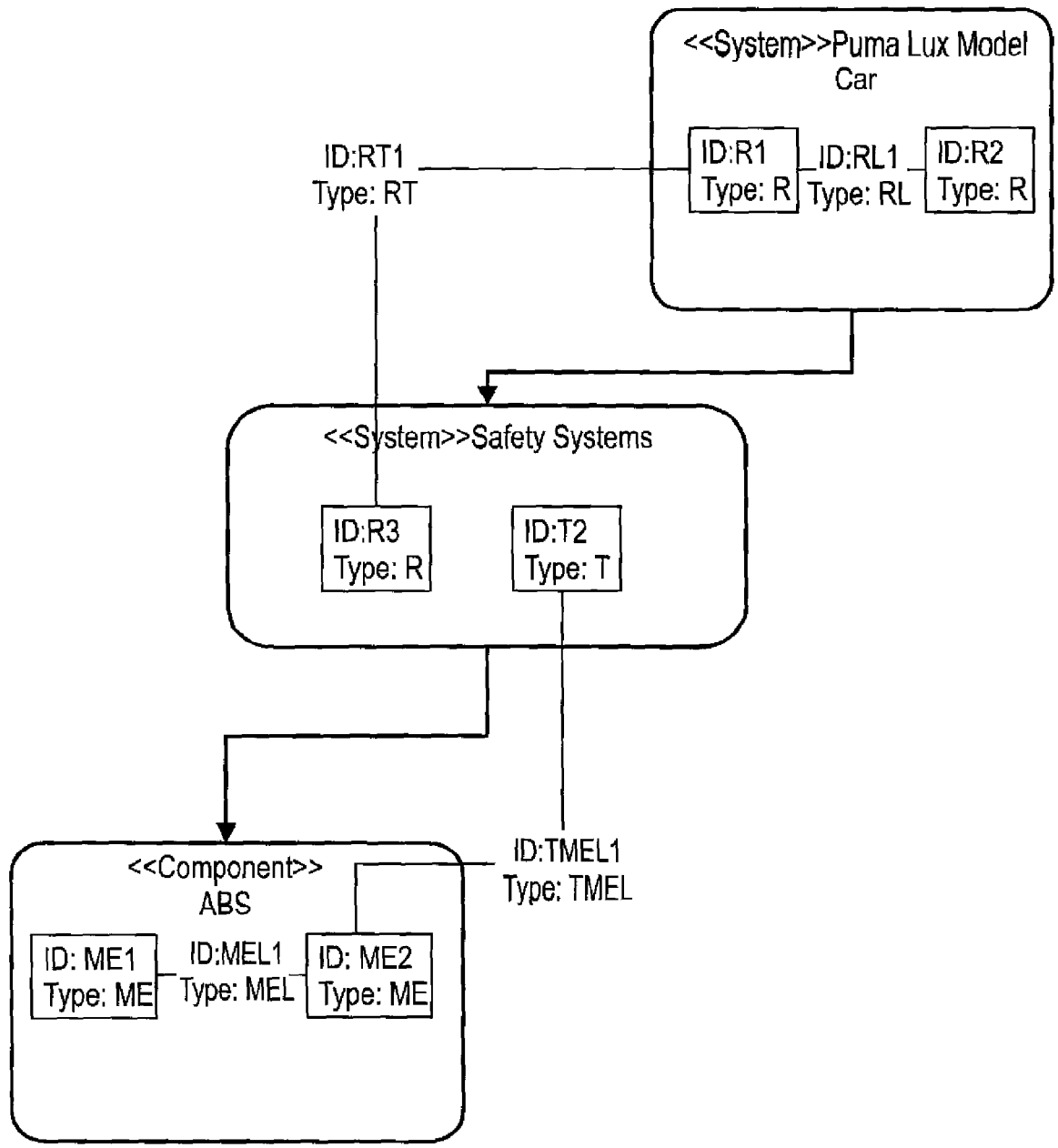
FIG. 8 is an illustration of a pivot view along with its unified model data index, according to some embodiments of the present invention.

Reference is now made to FIG. 8 illustrating a pivot view along with its unified model data index 800C, according to some embodiments of the present invention. The pivot view similar to the data engineering reference model instance described in FIG. 5. The unified model data index is as the unified model data index 600C described in FIG. 6C. A combination of the pivot view and the unified model data index may be provided to a user as a result output.

The methods as described above are used in the fabrication of integrated circuit chips.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It is expected that during the life of a patent maturing from this application many relevant systems and methods will be developed and the scope of the terms configuration management and baselines is intended to include all such new technologies a priori.

As used herein the term "about" refers to ±10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals there between.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method comprising:
generating a unified model data index by indexing a plurality of shared syntax elements describing at least one of a plurality of objects, attributes, and relationships of a plurality of data artifacts, each of said plurality of data artifacts corresponding to one of a plurality of engineering and non-engineering domains including hardware, software, electrical engineering, mechanical engineering, system architecture, manufacturing, computer-human interaction, and industrial design;
creating instances of an engineering reference model describing model properties including system, sub-system, product line, component, and part that define blocks and relationships between each of said data artifacts for each of said plurality of engineering and non-engineering domains; and
enriching said unified model data index by adding said relationships having a plurality of shared syntax elements of at least one instance of said engineering reference model to said plurality of shared syntax elements of said unified model data index to provide an enriched unified model data index.

2. The method of claim 1, further comprising presenting at least one part of said at least one instance of said engineering reference model.

3. The method of claim 2, further comprising allowing access to at least one of said unified model data index and said enriched unified model data index.

4. The method of claim 2, wherein said presenting is a cross-domain view point, across a said plurality of engineering and non-engineering domains, of said instances of said engineering reference model.

5. The method of claim 2, wherein said at least one of said plurality of data artifacts represents a multi-domain engineering product and said at least one part of said at least one instance is selected according to at least one aspect of said multi-domain engineering product.

6. The method of claim 5, wherein said at least one aspect is selected from a group consisting of entire product functionality, component-specific functionality, requirement verification, manufacturing cost and bill of materials.

7. The method of claim 2, further comprising presenting at least one of said plurality of data artifacts, thereby allowing a drill-down analysis of said at least one instance.

8. The method of claim 1, said generating said unified model data index further comprising filtering said plurality of shared syntax elements of said plurality of data artifacts.

9. The method of claim 1, wherein said adding of said relationships is performed by selectively mapping between said plurality of shared syntax elements of said at least one instance of said engineering reference model and said plurality of shared syntax elements of said unified model data index.

10. The method of claim 1, wherein said creating instances of an engineering reference model selectively describes a subset of said plurality of engineering and non-engineering domains.

11. The method of claim 1, wherein said describing said plurality of engineering and non-engineering domains comprises describing a plurality of cross-domain relations across said plurality of engineering and non-engineering domains.

12. The method of claim 1, wherein each of a plurality of instances of said engineering reference model enriching has a plurality of hierarchical relationships and said enriching is performed according to said plurality of hierarchical relationships.

13. A computer program product comprising:
a non-transitory computer readable storage medium including:
first program instructions to generate a unified model data index by indexing a plurality of shared syntax elements describing at least one of a plurality of objects, attributes, and relationships of a plurality of data artifacts, said plurality of data artifacts describing a plurality of engineering and non-engineering domains including hardware, software, electrical engineering, mechanical engineering, system architecture, manufacturing, computer-human interaction, and industrial design;
second program instructions to create instances of an engineering reference model describing model properties including system, sub-system, product line, component, and part that define blocks and relationships between each of said data artifacts for each of said plurality of engineering and non-engineering domains; and third program instructions to enrich said unified model data index by adding said relationships having a plurality of shared syntax elements of at least one instance of said engineering reference model to said plurality of shared syntax elements of said unified model data index to provide an enriched unified model data index;

said first, second and third program instructions being stored on said non-transitory computer readable storage medium.

14. A system comprising:

a memory that stores a unified model data index; and a processor including:

an indexing module which generates a unified model data index by indexing a plurality of shared syntax elements describing at least one of a plurality of objects, attributes, and relationships of a plurality of data artifacts, said plurality of data artifacts describing a plurality of engineering and non-engineering domains including hardware, software, electrical engineering, mechanical engineering, system architecture, manufacturing, computer-human interaction, and industrial design;

a creation module which creates instances of an engineering reference model describing model properties including system, sub-system, product line, component, and part that define blocks and relationships between each of said data artifacts for each of said plurality of engineering and non-engineering domains; and an enrichment module which enriches said unified model data index by adding said relationships having a plurality of shared syntax elements of at least one instance of said engineering reference model to said plurality of shared syntax elements of said unified model data index to provide an enriched unified model data index.

15. The system of claim 14, further comprising an interface module which performs at least one of presenting at least one part of said at least one instance of an engineering reference model, allowing a user to access said enriched unified model data index, presenting a cross-domain view point of said engineering reference model, presenting said engineering reference model according to at least one aspect of said multi-domain engineering product.

* * * * *